(12) United States Patent
Moors et al.

(10) Patent No.: US 7,714,306 B2
(45) Date of Patent: May 11, 2010

(54) LITHOGRAPHIC APPARATUS AND DEVICE MANUFACTURING METHOD

(75) Inventors: Johannes Hubertus Josephina Moors, Helmond (NL); Levinus Pieter Bakker, Helmond (NL); Frank Jeroen Pieter Schuurmans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 771 days.

(21) Appl. No.: 11/512,432

(22) Filed: Aug. 30, 2006

(65) Prior Publication Data

US 2008/0054189 A1   Mar. 6, 2008

(51) Int. Cl.
*G21K 5/10* (2006.01)
(52) U.S. Cl. .................... 250/492.2; 250/492.1
(58) Field of Classification Search .... 250/492.1–492.3
See application file for complete search history.

(56) References Cited

U.S. PATENT DOCUMENTS 6,797,964 B2 * 9/2004 Yamashita ............. 250/423 R
6,838,684 B2 * 1/2005 Bakker et al. ............ 250/492.2
7,279,690 B2 * 10/2007 Bakker et al. ............ 250/492.2
7,361,911 B2 * 4/2008 Moors et al. ............. 250/492.2
2006/0219950 A1 * 10/2006 Bakker et al. ............ 250/492.2

FOREIGN PATENT DOCUMENTS

WO   WO 2005/064401 A2   7/2005
WO   WO 2005/064401 A3   7/2005

* cited by examiner

*Primary Examiner*—Jack I Berman
*Assistant Examiner*—Andrew Smyth
(74) *Attorney, Agent, or Firm*—Pillsbury, Winthrop Shaw Pittman, LLP

(57) ABSTRACT

A lithographic apparatus includes a radiation source configured to emit radiation to form a radiation beam, the radiation being of a type which can create plasma in a low pressure environment in the apparatus, and an optical component configured to condition the radiation beam, impart the conditioned radiation beam with a pattern in its cross-section to form a patterned radiation beam, project the patterned radiation beam onto a target portion of a substrate, and/or to detect radiation. The optical component is provided with a plasma quenching structure, the plasma quenching structure being configured to provide electron-ion recombination in, on and/or or near the optical component.

24 Claims, 4 Drawing Sheets

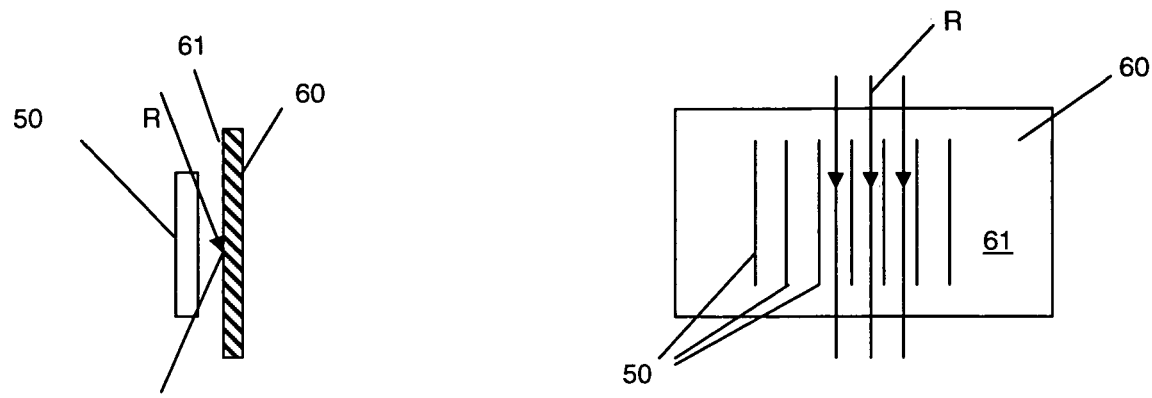
FIG. 7A
FIG. 7B
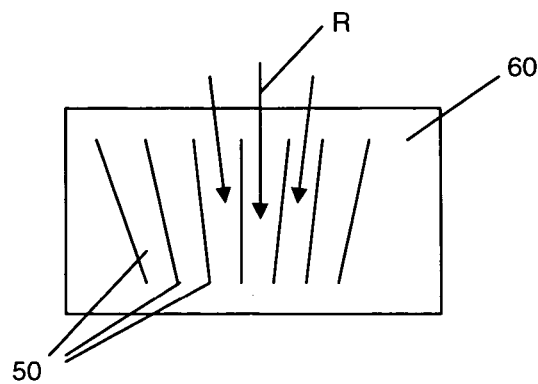
FIG. 7C

LITHOGRAPHIC APPARATUS AND DEVICE MANUFACTURING METHOD

BACKGROUND OF THE INVENTION

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In the apparatus, during use, background plasma can be present. For example, during use, the radiation beam traversing a low pressure interior space of the lithographic apparatus can lead to local plasma generation, particularly, in case the radiation is EUV (Extreme Ultra Violet) radiation. Also, for example, the apparatus can comprise a plasma radiation source, to provide the radiation, wherein a small amount of plasma may escape from the radiation source, towards optical components in the lithographic apparatus.

One or more of such background plasmas can impair operation of optical components of the lithographic apparatus. For example, the background plasma can lead to sputtering of optical surfaces nearby optical components, in the case that accelerated plasma particles at least achieve a certain sputtering threshold (kinetic) energy.

WO 2005/064401 describes an apparatus, comprising a debris-mitigation system that mitigates debris particles, for example charged particles, during use of the apparatus. The debris-mitigation system is arranged to apply a magnetic field so that at least charged debris particles are mitigated. The magnetic field can bring electrons (and other charged particles) into a spiraling movement.

SUMMARY OF THE INVENTION

Embodiments of the invention include a lithographic apparatus wherein plasma related sputtering of optical components can be reduced or avoided.

According to an embodiment, an apparatus comprises a radiation source configured to emit radiation to form a radiation beam, the radiation being of a type which can create plasma in a low pressure environment in the apparatus; a number of optical components, configured to condition the radiation beam, to impart the conditioned radiation beam with a pattern in its cross-section to form a patterned radiation beam, to project the patterned radiation beam onto a target portion of a substrate, to detect radiation, wherein at least one of the optical components of the apparatus is provided with a plasma quenching structure, the plasma quenching structure being configured to provide electron-ion recombination enhancement walls in, on and/or near the respective optical component.

According to another embodiment, a lithographic device manufacturing method comprises projecting a patterned beam of radiation onto a substrate, wherein a radiation beam is being transmitted towards the substrate using a number of optical components, radiation of the radiation beam is of a type which can create plasma in and/or near the optical components, at least one plasma quenching structure is being arranged in or near the path of the radiation beam, in and/or near at least one of the optical components, to enhance electron-ion recombination and/or to reduce or avoid any plasma induced negatively biasing of an optical surface of the respective optical component.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7A depicts a cross-section of an embodiment of an assembly of an optical component and a plasma quenching structure according to an embodiment of the invention;

FIG. 7B depicts a plan view of FIG. 7A; and

FIG. 7C depicts an alternative embodiment of the assembly.

DETAILED DESCRIPTION

Figure 1:
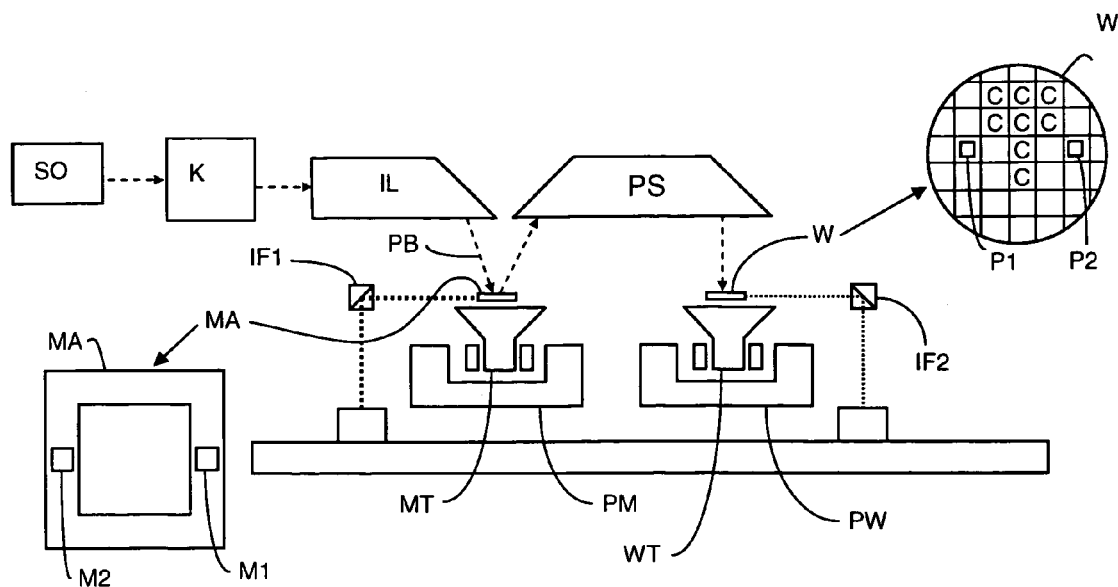
FIG. 1 depicts a lithographic apparatus according to an embodiment of the invention.

FIG. 1 schematically depicts a lithographic apparatus according to one embodiment of the invention. The apparatus comprises a number of optical components, configured to condition a radiation beam B, to impart the conditioned radiation beam with a pattern in its cross-section to form a patterned radiation beam, and to project the patterned radiation beam onto a target portion of a substrate W. In FIG. 1, the apparatus may comprise an illumination system (illuminator) IL configured to condition a radiation beam B (e.g. UV radiation or other types of radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device." The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. In an embodiment, the radiation source is a plasma EUV source, for example a tin (Sn) plasma EUV source. For example, in such a radiation source, Sn atoms can be heated (such as electrically) using a low power laser. The EUV radiation source can also be a different radiation source, for example a Li or Xe fueled plasma radiation source. Also, during use, plasma electrons may escape from the source SO, towards a collector K and the illuminator IL. The collector K can collect radiation from the radiation source SO. The collector K can be arranged to transmit the collected radiation to the illumination system IL. Particularly, the collector K can be arranged to focus incoming radiation, received from the radiation source, onto a small focusing area or focusing point.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Being reflected on the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT provide electron-ion recombination enhancement walls in, on and/or near the respective optical component or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
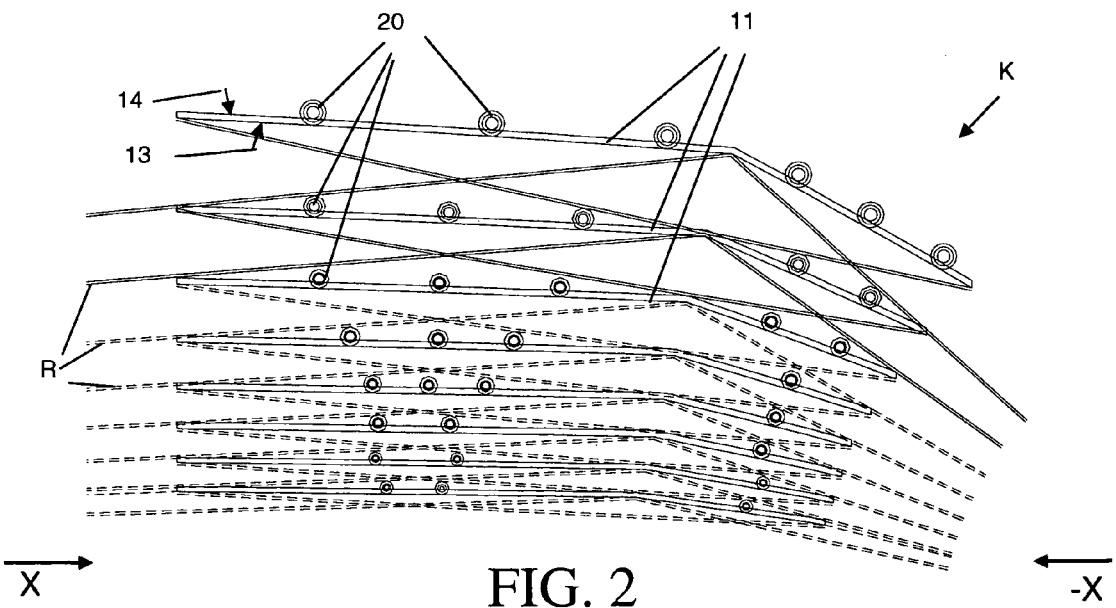
FIG. 2 depicts a longitudinal cross-section of part of an embodiment of a collector.
Figure 3:
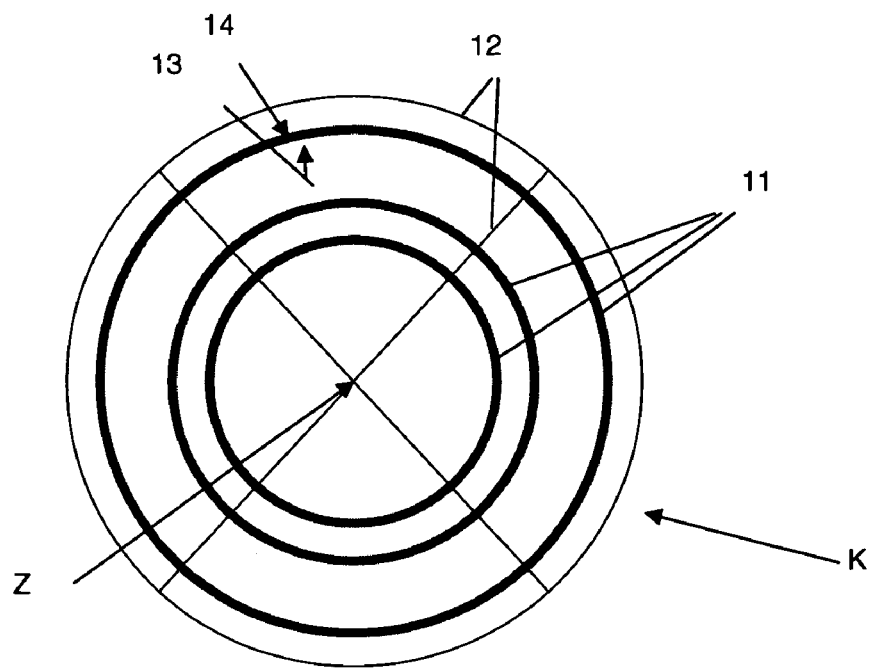
FIG. 3 depicts a front view, in a direction X, of the embodiment of FIG. 2.

FIGS. 2-3 depict in more detail a collector K of the lithographic apparatus as shown in FIG. 1. In the present embodiment, the collector is a nested grazing incidence collector. The collector K comprises mirrors 11 to focus the radiation R, which radiation the collector K receives from a first (for example intermittent) radiation source SO. The first radiation source SO is depicted in FIG. 1.

The collector K may be arranged at least partly according to the collector as disclosed in U.S. Pat. No. 7,015,489, or in a different manner. For instance, the collector may be suitable for illumination systems with a wavelength of equal to or smaller than about 193 nm, equal to or smaller than about 126 nm, or EUV wavelengths (for example about 10-20 nm). In an embodiment, the collector comprises a plurality of reflecting elements, or collector shells, 11 in the form of rotationally symmetrical mirror shells, which are arranged in one another around a common axis of rotation Z (see FIG. 3). The concentrically arranged collector shells 11 can be attached to each other for instance by coupling members 12, for example spokes or spoke-like elements (as part of a spoke wheel) or other suitable coupling members or support elements, as has been depicted in FIG. 3 (these coupling members 12 are not depicted in FIG. 2).

Each reflecting element 11 can comprise a reflecting inner surface 13 for reflecting the radiation R, as well as an outer surface 14 or back side which is faced away from the reflecting surface 13, see FIGS. 2 and 3. For example, the reflecting surface can be provided by making the reflecting element 11 from one or more suitable radiation reflecting materials, and/or to provide the surface with a suitable reflective coating.

The elements 11 can be provided with cooling channels 20 for cooling the reflecting elements 11. For example, such cooling ducts can extend substantially in shadow areas in the collector.

The collector K can be arranged to focus the incoming radiation R onto a certain focus point. The focus point may be, for instance, a small focusing area. The focus point may be situated, for instance, before the illuminator IL of the lithographic apparatus.

During use of the apparatus in a device manufacturing method, the radiation source SO can emit radiation to form a radiation beam, the radiation being of a type (for example EUV radiation) with can create plasma in a low pressure (i.e. vacuum, for example a pressure in the range of about 1E-4 to 1 mbar) environment in the apparatus. Such a plasma is particularly created by radiation induced photoionisation and/or by electrons that may be emitted by the radiation source SO. The plasma can lead to sputtering of optical surfaces, of optical components, for example of a collector and/or projection optics, in the apparatus. It is believed that the plasma can be very mobile, and can hit the surface of optical components, thereby dragging ions towards that surface. The ions can gain enough energy to significantly sputter the optical surface upon hitting the surface, thus reducing or impairing desired optical properties of the respective optical component (for example reflectivity). Particularly, sputtering can occur in case the ions gain an energy equal to or greater than a certain sputtering threshold energy.

To simply reduce this plasma sputtering of optical components, a plasma quenching structure may be applied in the apparatus, in or near the respective optical component(s). For example, in an embodiment, this quenching can be such that any plasma induced negatively biasing of an optical surface of the respective optical component can be reduced or substantially avoided, so that plasma ion acceleration (towards that surface) can be reduced, as well as plasma related sputtering. For example, the quenching structure can be configured to provide such an amount of extra surface, that the build-up of the boundary layer in the plasma (the layer with the electrical field) is limited, compared to the case where no quenching structure is provided. The quenching can be achieved without the application of magnetic fields, thus providing respective benefits.

For example, the projection system of the apparatus can be provided with at least one plasma-quenching structure to quench plasma in the projection system. Besides, a collector K, or an other type of optical component, can be provided with at least one plasma-quenching structure. In the present application, the term "optical component" can include at least one of the following components: a mirror, a lens, a collector, a filter, a reticle, an illumination system, an energy sensitive device or sensor (e.g. to detect radiation to provide energy and/or intensity measurements). The optical component, and one or more optical surfaces thereof, can be configured to direct, shape, or control the radiation, or to detect the radiation. For example, the optical surface of the respective optical element/component can be a radiation reflecting surface (in case of a mirror element), a transmissive surface, or a surface having radiation absorbing parts.

The basics of plasma quenching are commonly known from plasma physics as such (in which case plasma quenching is undesired). To avoid plasma quenching, in plasma physics, the presence of ion/electron-recombination structures is avoided. Contrary, in the present lithography application, at least one of the optical components of the apparatus is provided with (or, in other words: associated with) a plasma quenching structure, the plasma quenching structure being configured to provide electron-ion recombination enhancement walls in, on and/or near the respective optical component, particularly close to an optical surface of that component. For example, the plasma-quenching structure can be a foil-trap-like structure, arranged to provide a large extra surface area in and/or near a respective optical component of the apparatus (the foil trap comprising a plurality of foils extending in and/or near the respective optical component), to promote the recombination of plasma electrons and plasma ions in and/or close to the optical component and to avoid generation of large ion accelerating fields (a foil trap as known from the prior art that is designed to trap contaminant particles, downstream from a radiation source, without substantially hindering, altering or affecting the transmission of radiation). The plasma quenching structure is configured so as to not substantially affect the lithography radiation beam, used to transfer a pattern to a substrate portion. For example, the plasma quenching structure can substantially extend parallel to the direction of the radiation rays. The plasma quenching structure can consist of a number of thin walls or platelets which can decrease the local density of charged particles (i.e. in the apparatus, near or in an optical component), leading to a decrease of the plasma sputtering rate, and preferably substantially preventing the plasma induced sputtering of one or more optical components. Embodiments are shown in FIGS. 4-7.

As is generally known, in plasma sputtering, plasma ions are accelerated towards a surface, the ions having sufficient energy to eject atoms from the surface. Acceleration can be achieved by an accelerating field in a mentioned surface boundary layer, the boundary layer being present due to relatively swift plasma electrons that negatively bias the surface with respect to the plasma. In a presently proposed plasma quenching, the extra surface area, that can be provided by the plasma quenching structure near and/or in an optical component, can provide a reduction of the speed of inbound plasma ions, by reducing, or substantially quenching, the negative biasing of an optical surface of an optical component. The extra surface area can be such that substantially no plasma ion accelerating field near the optical surface is present anymore, in other words, such that the voltage drop over the boundary layer is limited and that a mentioned sputtering threshold energy can not be achieved anymore by the inbound plasma ions.

Figure 4:
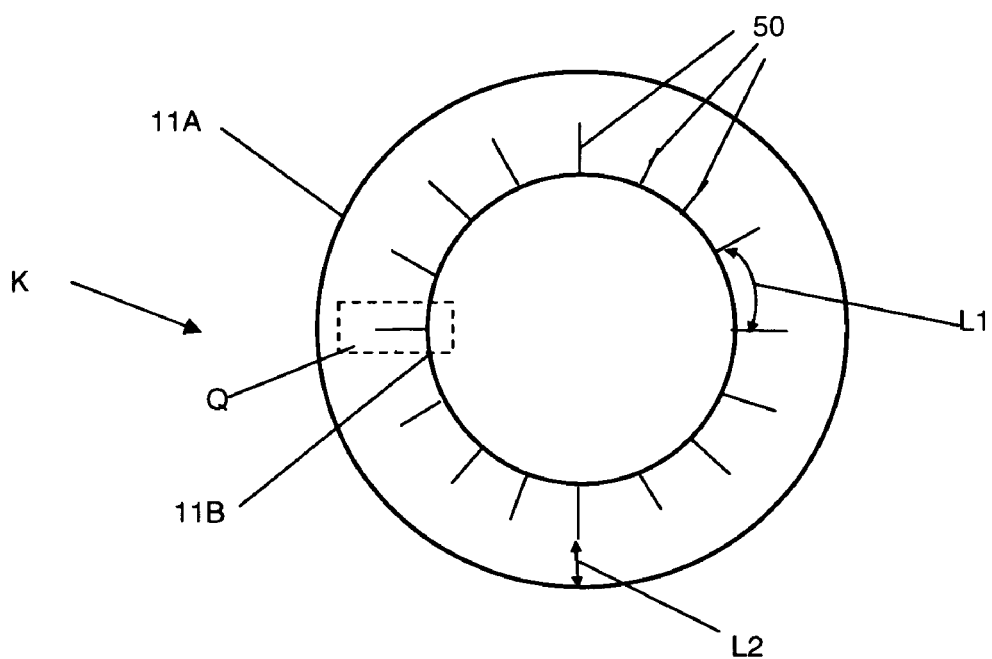
FIG. 4 depicts a further embodiment of a collector, having a plasma quenching structure.
Figure 5:
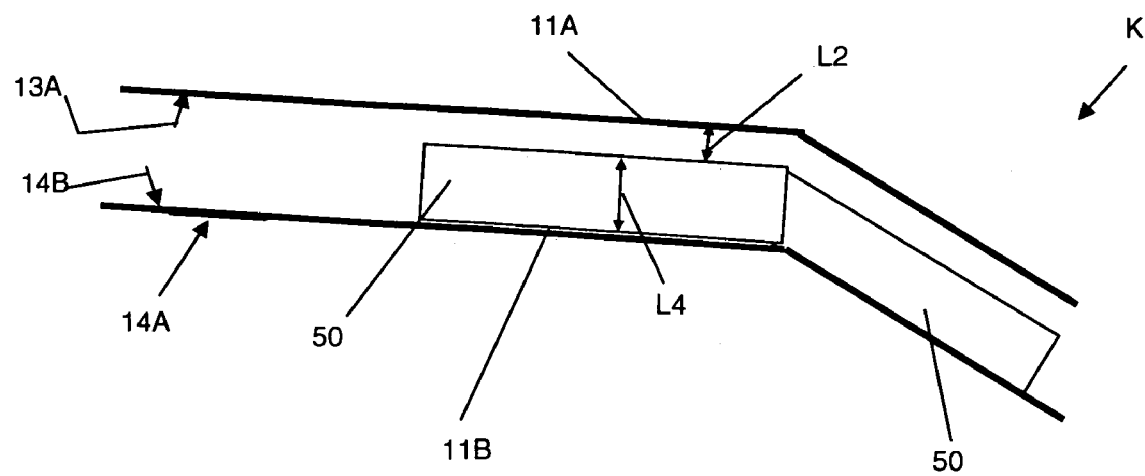
FIG. 5 depicts a longitudinal cross-section of part of the embodiment of FIG. 4.
Figure 6:
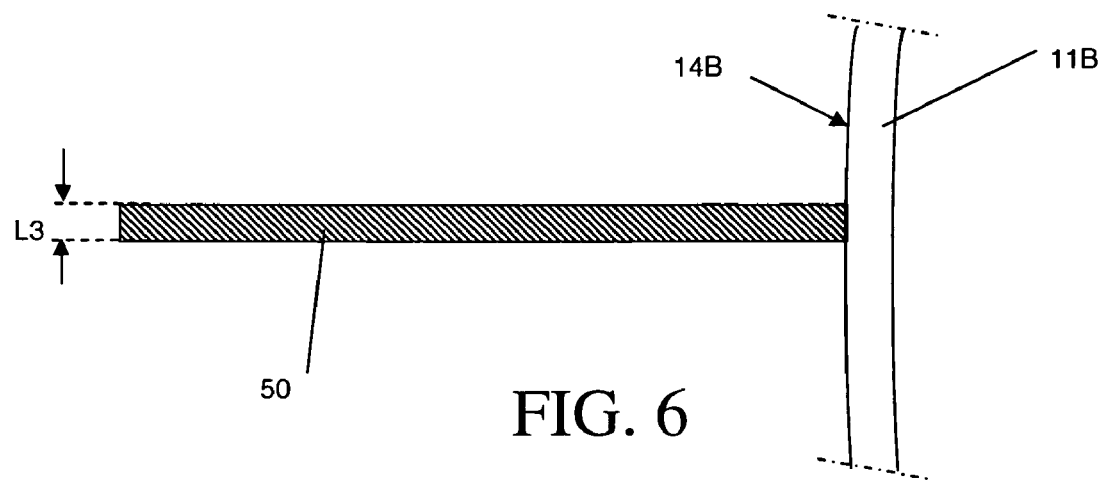
FIG. 6 depicts a detail Q of FIG. 4.

FIGS. 4-6 show an embodiment of part of the lithography apparatus, wherein a plasma quenching structure, having a plurality of walls or platelets 50, is provided. FIG. 4 is similar to FIG. 3, and shows part of a radiation collector K in a transversal cross-section (transversal to the optical axis, or radiation propagation direction). For clarity, only two collector shells 11A and 11B are depicted. The collector K show in FIG. 4 can be substantially the same as the embodiment shown in FIGS. 2-3, but further comprises the plasma quenching structure 50. FIG. 5 shows part of the collector K, in longitudinal cross-section (parallel to the optical axis).

In the present embodiment, a plurality of electron-ion recombination enhancement walls 50 extends near the reflective surface 13A of a collector shell 11A, in an area located opposite that surface. The walls 50, or platelets, protrude into the space which is traversed by the radiation beam during use. The walls 50 may be substantially uniformly distributed with respect to each other, in the space where plasma is to be quenched (i.e., the space extending between the collector shells 11A, 11B in the present embodiment). For example, the walls/platelets 50 can be spaced-apart at substantially equal distances, viewed in lateral directions (or circumferentially with respect to the collector center axis Z). The walls 50 can be relatively thin (laterally), and can be elongated plate-like elements, extending in straight (i.e., not curved) directions, parallel to the center axis Z.

In the present embodiment, the recombination enhancing walls 50 extend radially from one of the collector elements 11, i.e., radially with respect of the centre axis Z (see FIG. 3). Also, each recombination enhancing wall 50 may extend in the direction of the optical axis. From FIGS. 4 and 5 it follows, that each recombination enhancement wall 50 can substantially extend in-line with the optical path X, -X of the radiation beam (not depicted in FIG. 4-5, but partly shown in FIG. 2), such that the recombination enhancement walls 50 substantially do not block (or reduce, hinder, or negatively affect) transmission of the radiation beam through the collector K. Each wall 50 may be thin, for example with a lateral thickness L3 (see FIG. 6) of about 1 mm or less. Besides, as an example, each wall or platelet 50 can have a length of at least 1 cm (measured in the direction of radiation propagation). As an example, the length of each wall or platelet 50 can be at least the same as a length of the reflecting surface of a collector shell (measured in longitudinal collector direction). Preferably, the length of each wall or platelet 50 is at least the same as a length of part of the reflecting surface of the collector shell that does receive and reflect the radiation R during use, wherein the wall or platelet does extend opposite that reflecting surface part.

In the present embodiment, the walls 50 can protrude from an outer surface or back side 14B of one of the reflecting elements 11B towards the inner reflecting surface 13A, facing that back side 14B, of the opposite (more outer) reflecting element.

Also, for example, free (radially outer) edges of the plasma quenching walls 50 can be spaced-apart from the reflecting surface 13A of the more outer reflecting element 11A by a relatively short distance L2 (see FIG. 4-5), for example a distance L2 in the range of about 0-10 mm, or for example about 1 mm-5 mm, or for example about 1 mm. A number of such walls or platelets 50 may be provided on the collector element 11B.

In FIG. 4, sixteen (16) such walls 50 are depicted, for clarity. However, more plasma quenching walls 50 may extend into the area between the two collector elements 11A, 11B. For example a whole concentric volume between two concentric collector shells 11A, 11B can be provided with such walls 50. For example, at least fifty (50) plasma quenching walls 50 can be available, extending towards the reflecting surface 13A of at least one of the collector shells 11 (to quench plasma near the surface for protecting the surface 13A).

A number of plasma quenching platelets 50 can be arranged near each reflecting surface of each collector shell 11. Thus, in FIGS. 4 and 5, a number of such walls (not depicted) can extend opposite the reflecting surface of the inner collector shell 11B, towards that surface.

As an example only, depending on the dimensions of the collector K, a closest distance L1 between neighboring recombination enhancement walls 50 (see FIG. 4) can be in the range of about 1-10 mm, to provide a good plasma quenching operation, so that collector sputtering can be substantially avoided. In another embodiment, the overall surface area of the recombination enhancement walls 50 of the plasma-quenching structure can be larger than the area of the reflective surface 13A of the nearby collector shell 11A (towards which shell 11A the walls 50 extend). Besides, a radial width L4 of each of the walls 50 can be larger than half the radial distance between the two collector elements 11A, 11B (as in FIG. 5).

An additional feature of the embodiment of FIGS. 4-6 is that a gas conductivity of the collector K van be decreased by the plasma quenching structure, allowing a good differential pumping.

The plasma quenching walls 50 can be made of various materials. For example, these walls 50 can be made electrically conducting, or electrically insulating. In an embodiment, a relatively small electrical potential can be provided (for example by a suitable potential source, which is not depicted in the drawings) onto the plasma quenching walls 50. Such a potential can help the electron-ion recombination, and thus the quenching effect. In other words: adding a voltage to the walls 50 can increase the recombination efficiency on the walls 50.

The surface of each electron-ion recombination enhancement wall 50 can consist of the same material as the reflective surface 13A the nearby respective (in FIG. 4-5 outer) collector shell 11A. For example, each of these walls 50 can be made from one or more suitable radiation reflecting materials. Also, the outer surfaces of each wall 50 can be provided with a suitable reflective coating. For example, by choosing the material of the plasma quenching walls 50 equal to the material of the reflective surface 13A of the respective optical element (i.e. collector shell), any sputtering of the plasma quenching walls 50 (for example plasma induced sputtering) will not lead to a measurable reflectivity loss of that reflective surface 13A. The plasma quenching walls 50 of the collector K can function as getters for contaminating particles (for example metal particles, radiation source related particles, carbon particles and/or other contamination particles). The quenchers (or walls 50) can function as a foiltrap structure as well, for example to remove debris in the collector (or other respective optical element/component).

In an alternative embodiment (not shown), there can be provided a so-called normal incidence radiation collector, wherein a plasma quenching structure is arranged near or on that collector to reduce or avoid plasma sputtering of the collector (similar to the above embodiments). In that case, electron-ion recombination enhancement walls can be provided near a collector surface (for example at a distance less than 1 cm), the walls extending radially from the optical axis of the collector and extending close to a reflecting surface of the collector. Thus, the plasma quenching structure can be located at a distance less than 1 cm from the respective optical surface which is to be protected from plasma sputtering. For example, in this case, a high transmission of EUV radiation can be achieved.

FIGS. 7A-7B depicts an embodiment of an assembly of an optical component and a plasma quenching structure, of a lithographic apparatus. For example, the optical component can be a mirror 60 of a projection system PS, or an other lithography optical component. In the present arrangement, there is provided a plasma quenching structure, having a number of thin, elongated platelets 50 extending near a reflective surface of the optical element 60, opposite surface 61, and (in the present embodiment) substantially perpendicularly with respect to that surface. Arrows R depict radiation rays. In FIG. 7B, the radiation rays are substantially parallel to each other. The platelets 50 extend parallel to the direction of radiation propagation. Alternatively, as is shown in FIG. 7C, in case of converging radiation rays R, the platelets 50 can be arranged in a non-parallel manner with respect to each other, in line with the radiation, to avoid substantial blocking of the radiation R. In the embodiments of FIGS. 7A-7C, the thin elongated platelets 50, again, can quench any background plasma, so that plasma sputtering of a respective optical surface 61 can be reduced or avoided.

In the above embodiments, the plasma quenching structure arrangements 50 are spaced-apart from optical surfaces to be protected. Alternatively, for example, the optical (for example reflecting) surfaces can be provided with suitable plasma quenching structures 50. As an example, at least one of the optical components of the lithographic apparatus can be provided with one or more reflective surfaces to reflect the radiation beam, wherein a plurality of electron-ion recombination enhancement walls 50 is connected to that optical component, and for example protrudes from that surface.

Although specific reference may be made in this text to the use of lithographic apparatus in the manufacture of ICs, it should be understood that the lithographic apparatus and/or collector described herein may have other applications, such as the manufacture of integrated optical systems, guidance and detection patterns for magnetic domain memories, flat-panel displays, liquid-crystal displays (LCDs), thin film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 248, 193, 157 or 126 nm) and extreme ultra-violet (EUV) radiation (e.g. having a wavelength in the range of 5-20 nm), as well as particle beams, such as ion beams or electron beams. Particularly, the radiation is of a type that can generate plasma in a low pressure (vacuum) environment.

The term "lens", where the context allows, may refer to any one or combination of various types of optical components, including refractive, reflective, magnetic, electromagnetic and electrostatic optical components.

While specific embodiments of the invention have been described above, it should be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

For example, each electron-ion recombinating wall 50 can have various shapes (for example curved and/or straight), and dimensions, within the scope of the present invention.

Also, the walls 50 can be connected to a suitable support structure, or to a respective optical element, in various ways, for example, by welding, soldering, glue, conductive glue, 'ansprengen' (direct bonding), depending amongst others on the composition of the walls 50 and the respective support structure, or optical component.

Herein, for example, the plasma quenching structure can be such that a background-plasma is quenched, for example by at least 50% in density, and/or such that an plasma induced potential difference (potential drop) between optical component and plasma potential (accelerating ions towards a respective optical component or optical surface) is lower than 20 V.

What is claimed is:

1. A lithographic apparatus, comprising:
   an optical component configured to condition a beam of radiation from a radiation source, to impart the conditioned radiation beam with a pattern in its cross-section to form a patterned radiation beam, to project the patterned radiation beam onto a target portion of a substrate, and/or to detect the radiation, wherein the radiation is of a type which can create plasma in a low pressure environment in the apparatus; and
   a plasma quenching wall, the plasma quenching wall configured to provide electron-ion recombination in, on and/or less than or equal to about 1 cm from the optical component.

2. An apparatus according to claim 1, wherein the plasma quenching wall extends in-line with an optical path of the radiation beam, such that the wall does not substantially reduce transmission of the radiation beam.

3. An apparatus according to claim 1, wherein the optical component comprises a reflective surface to reflect the radiation beam, and the plasma quenching wall comprises a plurality of electron-ion recombination enhancement walls connected to the optical component.

4. An apparatus according to claim 1, wherein the optical component comprises a reflective surface to reflect the radiation beam, and the plasma quenching wall comprises a plurality of electron-ion recombination enhancement walls that extend near the reflective surface, in an area located opposite the reflective surface.

5. An apparatus according to claim 1, wherein the plasma quenching wall comprises a plurality of platelets protruding into a space traversed by the radiation beam.

6. An apparatus according to claim 5, wherein each platelet has a thickness less than 1 mm, and a length of at least 1 cm.

7. An apparatus according to claim 5, wherein a closest distance between neighbouring platelets is in the range of about 1-10 mm.

8. An apparatus according to claim 1, wherein a surface of the plasma quenching wall comprises the same material as a surface of the optical component.

9. An apparatus according to claim 1, wherein the plasma quenching wall comprises at least fifty electron-ion recombination enhancement walls in, on and/or near the optical component.

10. An apparatus according to claim 1, wherein the apparatus comprises a projection system to project the patterned radiation beam onto a target portion of a substrate, wherein the projection system is provided with the plasma quenching wall to quench plasma in the projection system.

11. An apparatus according to claim 1, comprising a collector configured to transmit radiation, received from a radiation source, to an illumination system, wherein the collector and/or the illumination system comprises the plasma quenching wall.

12. An apparatus according to claim 1, wherein the plasma quenching wall is configured to quench the plasma by at least 50% in density, during use.

13. An apparatus according to claim 1, wherein the plasma quenching wall is configured to decrease a potential drop between the plasma and the optical component to a value smaller than 20 V.

14. A lithographic device manufacturing method, comprising:
   projecting a patterned beam of radiation onto a substrate, wherein a radiation beam is transmitted towards the substrate using an optical component, radiation of the radiation beam is of a type which can create plasma in and/or near the optical component, and a plasma quenching wall is arranged in, on and/or less than or equal to about 1 cm from the optical component to enhance electron-ion recombination and to reduce or avoid any plasma induced negatively biasing of an optical surface of the optical component.

15. A lithographic device manufacturing method, comprising:
   projecting a patterned beam of radiation onto a substrate, wherein a radiation beam is transmitted towards the substrate using an optical component and radiation of the radiation beam is of a type which can create plasma in and/or near the optical component; and
   enhancing electron-ion recombination to reduce or avoid any plasma induced negatively biasing of an optical surface of the optical component by using an electron-ion recombination enhancement wall in, on and/or less than or equal to about 1 cm from the optical component.

16. A method according to claim 15, wherein the electron-ion recombination enhancement wall extends in-line with an optical path of the radiation beam, such that the recombination enhancement wall does not substantially reduce transmission of the radiation beam.

17. A method according to claim 15, wherein the optical component comprises a reflective surface to reflect the radiation beam, and the electron-ion recombination enhancement wall is connected to the optical component.

18. A method according to claim 15, wherein the optical component comprises a reflective surface to reflect the radiation beam, and the electron-ion recombination enhancement wall extends near the reflective surface in an area located opposite the reflective surface.

19. A method according to claim 15, wherein the electron-ion recombination enhancement wall comprises a plurality of platelets protruding into a space traversed by the radiation beam.

20. An apparatus according to claim 1, further comprising a radiation source configured to emit radiation of the type which can create plasma in a low pressure environment in the apparatus.

21. A method according to claim 14, wherein the plasma quenching wall comprises a plurality of platelets protruding into a space traversed by the radiation beam.

22. A method according to claim 14, wherein a surface of the plasma quenching wall comprises the same material as a surface of the optical component.

23. A method according to claim 14, wherein the plasma quenching wall is configured to quench the plasma by at least 50% in density, during use.

24. A method according to claim 14, wherein the plasma quenching wall is configured to decrease a potential drop between the plasma and the optical component to a value smaller than 20 V.

* * * * *